Sept. 20, 1960 L. PESSEL ET AL 2,953,616
THERMOELECTRIC COMPOSITIONS AND DEVICES UTILIZING THEM
Filed Aug. 26, 1958
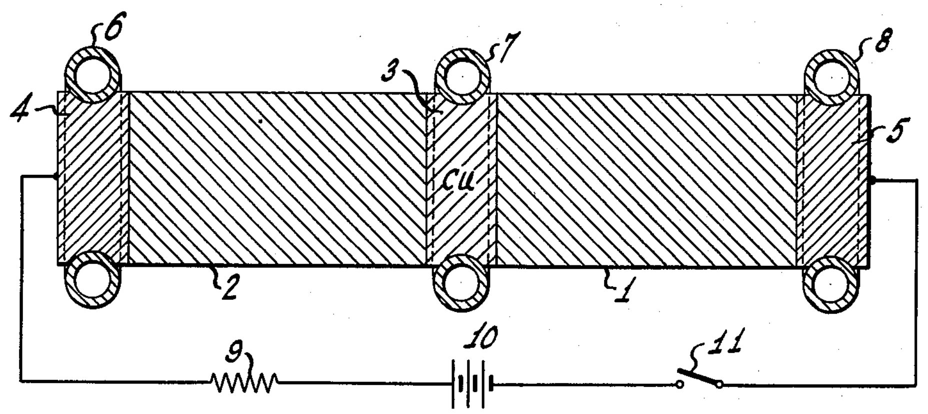
INVENTORS
LEOPOLD PESSEL &
THEODORE Q. DZIEMIANOWICZ
BY J. L. Whittaker
ATTORNEY United States Patent Office 2,953,616
Patented Sept. 20, 1960

2,953,616

THERMOELECTRIC COMPOSITIONS AND DEVICES UTILIZING THEM

Leopold Pessel, Wyndmoor, Pa., and Theodore Q. Dziemianowicz, Haddonfield, N.J., assignors to Radio Corporation of America, a corporation of Delaware Filed Aug. 26, 1958, Ser. No. 757,346
9 Claims. (Cl. 136—5)

This invention relates to improved thermoelectric compositions and improved devices made of these compositions. More particularly, this invention relates to improved compositions and elements useful in thermoelectric devices comprising one or more junctions between elements of different compositions.

When two wires of dissimilar thermoelectric compositions have their ends joined so as to form a continuous loop, a thermoelectric junction is established between the respective ends so joined. If the two junctions are maintained at different temperatures, an electromotive force will be set up in the circuit thus formed. This effect is called the thermoelectric or Seebeck effect and the device is called a thermocouple. The Seebeck effect is useful in many practical applications. For example, if one junction is maintained at a constant temperature the electromotive force produced is a function of the temperature difference between the two junctions. The temperature of the second junction may thus be read by connecting a galvanometer in series in the circuit. This arrangement is called a thermocouple thermometer. The Seebeck effect may also be utilized to transform heat energy from the sun or other sources directly into electrical energy. If an electromotive force is applied to the circuit described above, heat will be generated at one junction and absorbed at the other. This phenomenon is known as the Peltier effect and is useful in environmental heating and cooling.

As a consequence of the tendency of thermoelectric materials to either donate or accept electrons in a circuit, these materials may be classified as either N-type or P-type, respectively. Classification of a particular material may be determined by noting the direction of current flow across a junction formed by a particular thermoelectric material and another element when operating as a thermoelectric generator according to the Seebeck effect. The direction of the positive current at the cold junction in this case will be from the P-type and toward the N-type thermoelectric material. When the thermoelectric material and another element form a cold junction according to the Peltier effect, the impressed electromotive force will cause the current directions to be opposite those just described. The present invention relates to improved P-type thermoelectric materials.

There are three fundamental requirements for desirable thermoelectric materials. The first requirement is a high electromotive force per degree difference in temperature between junctions. This is referred to as the thermoelectric power of the material. The second requirement is a low heat conductivity, since it would be difficult to maintain either high or low temperatures at a junction if the material conducted heat too readily. The third requisite for a good thermoelectric material is high electrical conductivity or, conversely stated, low electrical resistivity. This is apparent since the temperature difference between junctions will not be great if the current passing through the circuit generates excessive Joulean heat.

A quantitative approximation of the quality of a thermoelectric material may be made by relating the above three factors by an approximate figure of merit, expressing it as $$F=\frac{Q^2}{pK}$$

where Q is the thermoelectric power, $p$ is the specific electrical resistivity, and K is the coefficient of thermal conductivity. The validity of this figure of merit as an indication of the usefulness of materials in practical applications is well established. Thus, as an objective, high thermoelectric power, high electrical conductivity and low thermal conductivity are desired. Since the electrical and thermal conductivities of metallic materials are related according to the Wiedemann-Franz-Lorenz rule that the absolute temperature times the ratio of electrical conductivity to heat conductivity is a constant equal to about $5\times10^7$, this objective becomes the provision of a material with maximum ratio of electrical to thermal conductivities and a high thermoelectric power.

In addition to the necessary thermoelectric properties just described, it is desirable that the compositions or alloys be easy to work and prepare. Many of the thermoelectric materials of the prior art are relatively weak physically, and tend to crumble like chalk. P-type compositions have been made by preparing bismuth telluride with from 0.5 to 2.5 mol percent excess bismuth, and N-type compounds have been made by preparing bismuth telluride with a small excess of tellurium, but the figure of merit of these compositions is low. Small amounts of elemental copper or silver have been added to such N-type compositions to reduce the electrical resistivity, but they adversely affect the thermoelectric power or Q, and are difficult to diffuse into the bismuth telluride lattice. Small amounts of mercury have been added to the P-type compositions, but it is difficult to obtain uniform mixtures with mercury, and the toxicity of mercury vapor is a serious problem in factory production.

One object of the instant invention is to provide improved thermoelectric compositions and alloys having improved thermoelectric powers.

Another object is to provide improved thermoelectric compositions which may be readily and easily prepared and have improved effective thermoelectric power.

Still another object of the invention is to provide improved thermoelectric devices capable of producing improved reduction in temperature.

The instant invention provides improved thermoelectric compositions having thermoelectric properties significantly better than those of previously known materials. The compositions according to one embodiment of the invention consist essentially of bismuth telluride alloyed with up to 2% of one or more of the oxides of copper, silver, gold and mercury. According to another embodiment of the invention, the alloy comprises 5–70 mol percent antimony telluride based on the weight of bismuth telluride, alloyed with up to 2% of one or more of the above mentioned oxides. According to still another embodiment, the alloy comprises 5–70 mol percent antimony telluride and 1–25 mol percent antimony selenide based on the weight of bismuth telluride. In all the embodiments the weight percent of oxides added is based on the total weight of the alloy.

The invention will be described in greater detail by reference to the accompanying drawing of which the single figure is a schematic, cross-sectional, elevational view of a thermoelectric element according to the invention.

P-type thermoelectric alloys according to the present invention consist principally of bismuth telluride, or bismuth-tellurium-antimony alloys, with 0.1% to 2% by weight of one or more of the oxides of copper, silver, gold and mercury. In those cases where the element forms more than one oxide, for example cuprous oxide and cupric oxide, both compounds are useful in the practice of the instant invention. According to one embodiment of the invention the alloy contains 5–70 mol. percent antimony telluride with the remainder bismuth telluride. According to another embodiment of the invention the alloy contains 5–70 mol percent antimony telluride and 1–25 mol percent antimony selenide, with the remainder bismuth telluride. The results obtained are quite unexpected, particularly in view of the fact that copper and silver have been used in N-type compositions, while the sulfides and selenides of copper and silver have been found to produce excellent N-type materials.

The thermoelectric element shown in the drawing is composed of two thermoelectrically different members 1 and 2 which are conductively joined by an intermediate conductive part 3 of negligible thermoelectric power. The P-type thermoelectric member 1 may, for example, consist of an alloy of 36.58 weight percent bismuth, 51.76 weight percent tellurium, and 11.66 weight percent antimony, which is optimum for these three components, plus at least 0.1 to 2.0 weight percent of at least one of the oxides of copper, silver, gold or mercury. The weight percentages of the added oxide or mixture of oxides are based on the total weight of the tellurium, bismuth and antimony. A preferred P-type alloy consists of by weight 51.62 percent tellurium, 36.48 percent bismuth, 11.63 percent antimony, and 0.27 percent cuprous oxide. This P-type alloy has a thermal E.M.F. of 204 microvolts per ° C. and a specific electrical resistivity of about .00087 ohm-cm. Other P-type thermoelectric materials according to the invention may be employed as desired.

The member 2 consists of an N-type thermoelectric material. Any of the known N-type materials may be utilized for this purpose. For example, bismuth telluride containing a small excess of tellurium (up to 1.32 weight percent excess) is one such N-type thermoelectric material. The intermediate part 3 which connects the differential members 1 and 2 to form a thermoelectric junction between them consists preferably of copper.

An energizing circuit comprising a current source 10, a resistor 9 and a carrier switch 11 is connected to the element through copper end terminals 4 and 5. The end terminals are provided with single turn pipe coils 6 and 8 through which a heat transporting fluid may be pumped to maintain them at a relatively constant temperature. Thus, when the action of the current through the thermoelectric junction produces a temperature differential between the intermediate terminal 3 and the end terminals, the end terminals may be maintained at a constant temperature and the intermediate terminal may be reduced in temperature.

The alloys of the invention are easily prepared by melting the proper combinations of bismuth, tellurium, antimony, and one or more of the oxides of copper, silver, gold or mercury. Selenium may be added to increase the band gap for certain applications, so that the amount of anitmony selenide present is 1–25 mol percent. The materials may be melted together in a sealed Vycor tube or a quartz ampule, for example, at a temperature at about 1400° F. and allowed to react for about an hour in a furnace which is slowly rocked to obtain uniform mixing of the melt. The tubes are permitted to cool in the furnace to about 300° F., then removed and crushed to obtain the solidified ingot.

A preferred P-type alloy of the invention was prepared by melting together the following constituents:

| | Grams | Wt. Percent |
|---|---|---|
| Bismuth | 13.15 | 36.48 |
| Tellurium | 18.61 | 51.62 |
| Antimony | 4.19 | 11.63 |
| Cuprous oxide | 0.10 | 0.27 |

This preferred P-type alloy exhibits a coefficient of thermal conductivity $k$=0.0176 watt/° C./cm. The figure of merit for this composition is .0021 or higher.

Another preferred P-type alloy was prepared by melting together the following constituents:

| | Grams | Wt. Percent |
|---|---|---|
| Bismuth | 13.15 | 36.21 |
| Tellurium | 18.61 | 51.25 |
| Antimony | 4.19 | 11.54 |
| Silver oxide ($Ag_2O$) | .36 | 1.00 |

The figure of merit of this material was .00212.

Still another preferred P-type alloy of the invention was prepared by melting together the following constituents:

| | Grams | Wt. Percent |
|---|---|---|
| Bismuth | 13.15 | 36.27 |
| Tellurium | 18.61 | 51.33 |
| Antimony | 4.19 | 11.56 |
| Mercuric oxide (HgO) | .30 | 0.84 |

The figure of merit for this composition was .00214.

While the theoretical reasons involved are not fully understood, the beneficial effect of the oxide additions according to the invention in raising the thermoelectric E.M.F. of P-type bismuth telluride materials is quite generally observed, regardless of the relative proportion of the basic elements in the undoped alloy. As an example, oxides according to the invention were added to bismuth-tellurium-antimony compositions having considerably less antimony than is required for optimum electrical properties. The original composition A without any oxides had a thermoelectric power Q of only 63 microvolts per ° C. Composition B with mercuric oxide exhibited a three-fold greater Q. Composition C containing $Ag_2O$ possessed an even higher thermoelectric power. Composition D with cuprous oxide displayed a value of Q more than double that of the original composition A. In each case the addition of one of the oxides according to the instant invention increased the thermoelectric E.M.F. without unduly increasing the specific resistivity $p$. These results are tabulated in Table I.

*Table 1*

| Comp. | Te | Bi | Sb | HgO | $Ag_2O$ | $Cu_2O$ | Q | p |
|---|---|---|---|---|---|---|---|---|
| | g. | g. | g. | g. | g. | g. | | |
| A | 18.61 | 13.15 | 3.54 | 0 | 0 | 0 | 63 | .00091 |
| B | 18.61 | 13.15 | 3.54 | 0.30 | 0 | 0 | 188 | .00074 |
| C | 18.61 | 13.15 | 3.54 | 0 | 0.075 | 0 | 196 | .00115 |
| D | 18.61 | 13.15 | 3.54 | 0 | 0 | 0.10 | 141 | .00114 |

There have thus been described improved thermoelectric materials of novel composition which possess advantageous thermoelectric properties and which are easily prepared. Thermal elements made from these materials are useful in various applications, such as heating, refrigeration, and air conditioning.

What is claimed is:

1. A thermoelectric alloy consisting essentially of bismuth telluride and 5–70 mol percent antimony telluride alloyed with from 0.1% to 2% by weight of at least one compound selected from the group consisting of the oxides of copper, silver, gold and mercury.

2. A thermoelectric alloy consisting essentially of bismuth telluride and 5–70 mol percent antimony telluride alloyed with .84% by weight mercuric oxide.

3. A thermoelectric alloy consisting essentially of bismuth telluride and 5–70 mol percent antimony telluride alloyed with 1% by weight silver oxide.

4. A thermoelectric alloy consisting essentially of bismuth telluride and 5–70 mol percent antimony telluride alloyed with .27% by weight cuprous oxide.

5. A thermoelectric element comprising two circuit members of thermoelectrically complementary materials, said members being conductively joined to form a thermoelectric junction, at least one of said two members consisting of an alloy of bismuth telluride and 5–70 mol percent antimony telluride with 0.1% to 2% by weight of a compound selected from the group consisting of the oxides of copper, silver, gold and mercury.

6. The invention according to claim 5 wherein said alloy contains .84% by weight mercuric oxide.

7. The invention according to claim 5 wherein said alloy contains 1% by weight silver oxide.

8. The invention according to claim 5 wherein said alloy contains .27% by weight mercuric oxide.

9. A thermoelectric alloy consisting essentially of bismuth telluride with 5–70 mol percent antimony telluride and 1–25 mol percent antimony selenide alloyed with from 0.1% to 2% by weight of at least one compound selected from the group consisting of the oxides of copper, silver, gold and mercury.

References Cited in the file of this patent

UNITED STATES PATENTS 2,762,857 Lindenblad -------------- Sept. 11, 1956

OTHER REFERENCES

Telkes: Journal of Applied Physics, vol. 18, 1947, pp. 1116–1127.